United States Patent
Mizutani (10) Patent No.: US 11,443,935 B2
(45) Date of Patent: Sep. 13, 2022

(54) TIME-OF-FLIGHT MASS SPECTROMETER

(71) Applicant: SHIMADZU CORPORATION, Kyoto (JP)

(72) Inventor: Shiro Mizutani, Kyoto (JP)

(73) Assignee: SHIMADZU CORPORATION, Kyoto (JP)

(*) Notice: Subject to any disclaimer, the term of this patent is extended or adjusted under 35 U.S.C. 154(b) by 19 days.

(21) Appl. No.: 17/053,397

(22) PCT Filed: May 31, 2018

(86) PCT No.: PCT/JP2018/020885
§ 371 (c)(1),
(2) Date: Nov. 6, 2020

(87) PCT Pub. No.: WO2019/229915
PCT Pub. Date: Dec. 5, 2019

(65) Prior Publication Data
US 2021/0233762 A1    Jul. 29, 2021

(51) Int. Cl.
*H01J 49/40* (2006.01)
*H01J 49/02* (2006.01)

(52) U.S. Cl.
CPC ......... *H01J 49/403* (2013.01); *H01J 49/022* (2013.01); *H01J 49/40* (2013.01)

(58) Field of Classification Search
CPC ......... H01J 49/022; H01J 49/40; H01J 49/403
See application file for complete search history.

(56) References Cited

U.S. PATENT DOCUMENTS

| | | | | |
|---|---|---|---|---|
| 9,870,910 | B2* | 1/2018 | Haufler | H01J 49/40 |
| 10,593,531 | B2* | 3/2020 | Mizutani | H01J 49/022 |
| 11,101,127 | B2* | 8/2021 | Mizutani | H01J 49/40 |
| 2013/0214148 | A1* | 8/2013 | Albeanu | H01J 49/403 |
| | | | | 250/282 |
| 2019/0006168 | A1* | 1/2019 | Mizutani | H01J 49/10 |
| 2019/0157058 | A1 | 5/2019 | Mizutani | |
| 2021/0233762 | A1* | 7/2021 | Mizutani | H03K 3/00 |

FOREIGN PATENT DOCUMENTS

WO    2018/037440 A1    3/2018

OTHER PUBLICATIONS

International Search Report of PCT/JP2018/020885 dated Jul. 31, 2018 [PCT/ISA/210].
Written Opinion of PCT/JP2018/020885 dated Jul. 31, 2018 [PCT/ISA/237].

* cited by examiner

*Primary Examiner* — Wyatt A Stoffa
(74) *Attorney, Agent, or Firm* — Sughrue Mion, PLLC (57) ABSTRACT

An acceleration voltage generator is configured to cause a power MOSFET to turn on or off to switch a high direct-current voltage, so as to generate a high-voltage pulse for an ejection of ions from an ion ejector. A drive signal is used to cause the power MOSFET to turn on, and further includes a secondary drive signal to recharge a gate capacitance to cause the power MOSFET to stay in an on-state. In a drive signal generator, edge detection circuits generate an edge detection signal based on a start signal; selection circuits generate a primary drive signal by adjusting the edge detection signal in its signal width; and a secondary drive signal generator includes multiple circuit elements such as a semiconductor element, and generates the secondary drive signal.

6 Claims, 4 Drawing Sheets

Fig. 4

TIME-OF-FLIGHT MASS SPECTROMETER

CROSS REFERENCE TO RELATED APPLICATIONS

This application is a National Stage of International Application No. PCT/JP2018/020885, filed May 31, 2018.

TECHNICAL FIELD

The present invention relates to a time-of-flight mass spectrometer (hereinafter, referred to as a "TOFMS"). More specifically, the present invention relates to a high-voltage power supply device configured to apply a high voltage to a predetermined electrode or electrodes in an ion ejector of a time-of-flight mass spectrometer so that ions are given acceleration energy for flying.

BACKGROUND ART

In a TOFMS, various ions derived from a sample are ejected from an ion ejector, and the time of flight required for each ion to fly a certain flight distance is measured. Each ion flies at a speed according to its mass-to-charge ratio m/z. Accordingly, the above-mentioned time of flight corresponds to the mass-to-charge ratio of the ion, and the mass-to-charge ratio of the ion can be determined based on its time of flight.

As one of TOFMS methods, an orthogonal acceleration TOFMS (hereinafter, referred to as an "OA-TOFMS") is known. As disclosed in Patent Literature 1, in the OA-TOFMS, a plate-shaped expulsion electrode and a planar grid-shaped extraction electrode are arranged to face in approximately parallel to each other, and an orthogonal acceleration space is sandwiched between the expulsion electrode and the extraction electrode. Ions to be measured are introduced into the orthogonal acceleration space in a direction approximately parallel to the surfaces of the expulsion electrode and the extraction electrode. Here, a high-voltage pulse at a predetermined level is applied to either the expulsion electrode or the extraction electrode, or to both, at a predetermined timing, so that the ions passing through the orthogonal acceleration space are given acceleration energy in a direction approximately orthogonal to the drift direction of the ions. Due to the acceleration energy, the ions are ejected from the orthogonal acceleration space into a flight space. While flying through the flight space, the ions are separated according to the mass-to-charge ratio, so as to reach a detector.

In the OA-TOFMS, when the ions are to be ejected from the orthogonal acceleration space, a high-voltage pulse having the magnitude on the order of kV with a short duration needs to be applied to the expulsion electrode and the extraction electrode. Patent Literature 1 discloses a power supply device for generating the high-voltage pulse. As will be described in detail later, the power supply device has a circuit having a configuration shown in FIG. 3. Schematically speaking, the power supply device includes: a pulse transformer 72 for transmitting a pulse signal from a control-system circuit to a power-system circuit while electrically insulating the control circuit that operates with a low voltage from the power circuit that operates with a high voltage; a primary-side drive circuit 71 for driving a primary winding of the pulse transformer 72; a secondary-side drive circuit 73 connected to a secondary winding of the pulse transformer 72; a high-voltage circuit (not shown) for generating a high direct-current voltage; and a switch circuit 74 including a plurality of metal-oxide-semiconductor field-effect transistors (MOSFETs) 741 to generate a pulsed voltage by turning on and off the direct-current voltage generated by the high-voltage circuit according to a control voltage provided through the secondary-side drive circuit 73.

When a drive signal inputted to a positive-side drive signal input terminal 771 reaches a high level, a current flows downward in the primary winding of the pulse transformer 72, inducing a predetermined voltage between two ends of the secondary winding. The voltage is applied to a gate terminal of each of the plurality of MOSFETs 741 at the positive side (shown above a voltage output terminal 78 in FIG. 3) through the secondary-side drive circuit 73. Thus, the plurality of MOSFETs 741 at the positive side are turned on. Meanwhile, the plurality of MOSFETs 741 at the negative side (shown below the voltage output terminal 78 in FIG. 3) are in the off-state, and a voltage applied to a voltage supply terminal+V (e.g., +2500 V) is outputted from the voltage output terminal 78. When the drive signal inputted to the positive-side drive signal input terminal 771 is changed to a low level, the voltage between two ends of the primary winding of the pulse transformer 72 becomes zero. However, the gate voltage of each of the MOSFETs 741 stays at approximately the same value due to a charge previously stored in an input capacitance of the gate terminal of the corresponding MOSFET 741. Accordingly, the MOSFETs 741 at the positive side stay in the on-state, and the high voltage applied to the voltage supply terminal+V continues to be outputted from the voltage output terminal 78.

Next, when a drive signal inputted to a negative-side drive signal input terminal 772 reaches the high level, the current flows upward in the primary winding of the pulse transformer 72, inducing a voltage of polarity reverse to the previous case between the two ends of the secondary winding. The voltage is applied to a gate terminal of each of the plurality of MOSFETs 741 at the negative side through the secondary-side drive circuit 73. Thus, the plurality of MOSFETs 741 at the negative side are turned on. Meanwhile, the plurality of MOSFETs 741 at the positive side are turned off. As a result, a voltage applied to a voltage supply terminal—V (e.g., 0 V) is outputted from the voltage output terminal 78. With this configuration, during a period between when the drive signal inputted to the positive-side drive signal input terminal 771 reaches the high level and when the drive signal inputted to the negative-side drive signal input terminal 772 reaches the high level, the voltage output terminal 78 outputs the high-voltage pulse of, for example, +2500 V; and outside the period, the voltage output terminal 78 outputs the high-voltage pulse of 0 V.

As described above, the TOFMS measures the time of flight for each of the ions, with the point in time of the ejection of the ions or the acceleration of the ions defined as the time-of-flight value of zero. Accordingly, in order to enhance the accuracy in the measurement of the mass-to-charge ratio, the point in time of the initiation of the time-of-flight measurement needs to coincide as much as possible with the timing of the actual application of the high-voltage pulse to the expulsion electrode or the like to cause the ejection of the ions. A major factor causing the discrepancy in timing is a change in characteristics of each circuit element (e.g., a semiconductor component or a pulse transformer) due to a change in ambient temperature. In view of such a problem, Patent Literature 1 discloses a power supply device. The power supply device is configured to monitor the ambient temperature of the power supply device and adjust a supply voltage of the primary-side drive circuit 71 according to the ambient temperature monitored. With this configuration, the discrepancy in timing at which the MOSFETs 741 are turned on is corrected.

CITATION LIST

Patent Literature

Patent Literature 1: WO 2018/037440 A

SUMMARY OF INVENTION

Technical Problem

The technique described above is used as a countermeasure to reduce a discrepancy in timing of generation of the high-voltage pulse, the discrepancy caused by the temperature or others. Thus, the technique is reasonably effective to improve the accuracy in the measurement of the mass-to-charge ratio. On the other hand, the present inventors have experimentally confirmed that the discrepancy in timing of the generation of the high-voltage pulse is not significantly reduced by the countermeasure related to a power supply device as described above. More specifically, when the temperature causes the discrepancy or fluctuation in timing of the generation of the high-voltage pulse, the discrepancy or fluctuation relatively occurs slowly. However, the present inventors have confirmed that the discrepancy or fluctuation in timing of the generation of the high-voltage pulse also occurs at a very short time interval. In a TOFMS, a plurality of measurements are frequently repeated to integrate a plurality of mass spectrum (time-of-flight spectrum) data, based on which a mass spectrum is prepared. Accordingly, when the discrepancy or fluctuation in timing of the generation of the high-voltage pulse occurs at the short time interval as described above, mass resolution decreases in the mass spectra integrated.

The present invention has been developed to solve the above problems. An object of the present invention is to provide a time-of-flight mass spectrometer configured to reduce a time discrepancy between a point in time of initiation of a time-of-flight measurement and that of ejection of ions, the time discrepancy caused by various factors and not fully resolved by conventional techniques. Accordingly, high accuracy in measurement of a mass-to-charge ratio as well as high mass resolution is achieved.

Solution to Problem

The present inventors have found through experiments that jitter, in other words, temporal fluctuation of the drive signals inputted to the power supply device mainly causes the above-described state in which the discrepancy or fluctuation in timing of the generation of the high-voltage pulse occurs at the short time interval. In a power supply device of the TOFMS disclosed in Patent Literature 1 or others, a high-voltage pulse is changed at timing of change in a drive signal (more specifically, rising of the drive signal) inputted to the power supply device. Thus, the jitter in the drive signal inputted to the power supply device causes a temporal fluctuation in change of the high-voltage pulse, thereby resulting in a discrepancy in timing of start of an ejection of ions. Further, even with some correction to reduce an influence of an ambient temperature of the power supply device, an influence of fluctuation of the drive signal inputted to the power supply device due to a change in temperature is hardly corrected, and this fluctuation of the drive signal is a factor causing a discrepancy or fluctuation in timing of the generation of the high-voltage pulse. Based on these findings, the present inventors have developed the present invention.

In other words, the present invention developed for solving the above problems is a time-of-flight mass spectrometer provided with an ion ejector for ejecting ions to be measured into a flight space by imparting acceleration energy to the ions by an effect of an electric field created by a voltage applied to an electrode, and a high-voltage pulse generator for generating a high-voltage pulse to cause an ejection of the ions and applying the high-voltage pulse to the electrode, the high-voltage pulse generator including:

a) a direct-current power supply for generating a high direct-current voltage;

b) a switch circuit including a semiconductor switching element for generating the high-voltage pulse by switching the high direct-current voltage;

c) a switching element drive unit for charging or discharging a capacitance of a control terminal of the semiconductor switching element according to a drive signal outputted by the drive signal generator described later, in order to cause the semiconductor switching element to turn on or stay in an on-state or cause the semiconductor switching element to turn off or stay in an off-state; and d) a drive signal generator for outputting, as the drive signal, a primary drive signal and a secondary drive signal with a delay from the primary drive signal, each based on a start signal that has a voltage level changed at a timing of the ejection of the ions, the secondary drive signal to cause the semiconductor switching element to stay in the on-state or the off-state, the drive signal generator including a secondary drive signal generator for generating the secondary drive signal, and outputting, as the drive signal, the primary drive signal that does not pass through the secondary drive signal generator, at least at a timing of causing the semiconductor switching element to turn on in order to cause the ejection of the ions from the ion ejector to start.

Note that, the start signal inputted to the drive signal generator is assumed to be at a voltage level that the drive signal generator is capable of operating.

In a TOFMS according to the present invention, for example, when the high-voltage pulse inputted from the high-voltage pulse generator to the ion ejector rises, the ions are accelerated in the ion ejector and start to be ejected into the flight space. In other words, the rising of the high-voltage pulse corresponds to the timing of the start of the ejection of the ions. When the semiconductor switching element turns on in the switch circuit, the high-voltage pulse rises. When the drive signal is inputted from the drive signal generator at a predetermined timing, the switching element drive unit charges the capacitance of the control terminal of the semiconductor switching element (for example, a gate terminal when the semiconductor switching element is an MOSFET) to cause the semiconductor switching element to turn on. Further, when the semiconductor switching element needs to stay in the on-state for a predetermined period of time or longer, the switching element drive unit recharges the capacitance of the control terminal of the semiconductor switching element according to the drive signal inputted from the drive signal generator. Note that, for the capacitance of the control terminal of the semiconductor switching element, an input capacitance of the corresponding semiconductor switching element may be used; and when the input capacitance is not sufficient, other capacitors may be additionally used.

In other words, the switching element drive unit charges the capacitance of the control terminal of the semiconductor switching element according to the drive signal inputted from the drive signal generator as follows: charging the capacitance to almost a fully discharged state as at a previous stage or charging the capacitance that has been charged with a reverse voltage (hereinafter, the charging may be referred to as a "new charging" to make a comparison with recharging); or recharging the capacitance. When the drive signal is inputted at the timing of causing the semiconductor switching element to turn on such that the high-voltage pulse rises, the drive signal corresponds to the primary drive signal that does not pass through the secondary drive signal generator in the drive signal generator. On the other hand, when the drive signal is inputted for recharging the capacitance of the control terminal of the semiconductor switching element, the drive signal corresponds to the secondary drive signal that has passed through the secondary drive signal generator in the drive signal generator.

Accordingly, in a signal path from an input terminal of the drive signal generator to an output terminal of the drive signal generator, the secondary drive signal for the recharging passes through more number of circuit elements than the primary drive signal for the new charging. With more number of the circuit elements inserted in series, jitter occurring in each of the circuit elements tends to increase. In other words, the primary drive signal inputted to the switching element drive unit at the new charging passes through a relatively small number of the circuit elements inserted in series, while the secondary drive signal inputted to the switching element drive unit at the recharging passes through a relatively large number of the circuit elements inserted in series. Thus, with the primary drive signal, it is possible to more effectively suppress the jitter or the fluctuation of the signal due to the change in ambient temperature. With this configuration, it is possible to more significantly reduce the jitter in the rising of the high-voltage pulse for the ejection of the ions or the fluctuation in timing due to the change in temperature; and thus, it is possible to reduce the discrepancy in timing of the start of the ejection of the ions.

In the drive signal generator according to the present invention, at least at the timing of causing the semiconductor switching element to turn on such that the ions start to be ejected from the ion ejector, the drive signal that has only passed through minimally required circuit elements is preferably outputted as the primary drive signal. Here, the minimally required circuit element is a circuit element configured to form a circuit that outputs a voltage signal at a predetermined size at a timing corresponding to the change in voltage level of, for example, the start signal. The circuit corresponds, for example, to an edge detection circuit to detect the change in voltage level (i.e., an edge) of the start signal at the ejection of the ions. The circuit formed of the circuit element is desirably, for example, a CR differentiation circuit including a capacitor element and a resistor element, but not including an active element, e.g., a semiconductor element, as a factor causing the jitter. Accordingly, when the drive signal generator carries out various processes, such as switching between outputting the drive signal and stopping outputting the drive signal (or gating of the drive signal), respectively according to execution and stop of the measurement, switching a polarity according to switching between positive ionization and negative ionization, and removal of noise superposed on the signal, the drive signal generator may output, as the primary drive signal, the drive signal that does not pass through multiple circuit elements including the semiconductor elements required for carrying out these processes, at least at the timing of causing the semiconductor switching element to turn on such that the ions start to be ejected from the ion ejector.

In the time-of-flight mass spectrometer according to one aspect of the present invention, the switch circuit includes: a positive-side semiconductor switching element for, when in an on-state, outputting a positive-side voltage from the direct-current power supply to a voltage output terminal; and a negative-side semiconductor switching element for, when in an on-state, outputting a negative-side voltage from the direct-current power supply to the voltage output terminal, the switching element drive unit includes: a first switching element drive unit for, in response to a first drive signal, charging the control terminal to a voltage at which the positive-side semiconductor switching element turns on or stays in an on-state; and a second switching element drive unit for, in response to a second drive signal, charging the control terminal to a voltage at which the negative-side semiconductor switching element turns on or stays in an on-state, and the secondary drive signal generator further includes a distribution unit for distributing a signal based on the start signal inputted to a signal corresponding to the first switching element drive unit and to a signal corresponding to the second switching element drive unit, and based on the signals distributed by the distribution unit, separately generates at a predetermined time interval each of the secondary drive signal to cause the positive-side semiconductor switching element to stay in the on-state or the off-state and the secondary drive signal to cause the negative-side semiconductor switching element to stay in the on-state or the off-state.

In this description, the positive-side voltage and the negative-side voltage do not respectively correspond to voltages having positive and negative polarities. Here, the positive-side voltage is relatively higher in voltage than the negative-side voltage. Thus, for example, each of the positive-side voltage and the negative-side voltage may be positive, and each of the positive-side voltage and the negative-side voltage may be negative. Further, "positive-side" of the positive-side semiconductor switching element indicates that the positive-side semiconductor switching element is disposed, for example, between the positive-side voltage and the voltage output terminal, Thus, when in the on-state, the positive-side semiconductor switching element functions to output the positive-side voltage to the voltage output terminal. Similarly, "negative-side" of the negative-side semiconductor switching element indicates that the negative-side semiconductor switching element is disposed, for example, between the negative-side voltage and the voltage output terminal. Thus, when in the on-state, the negative-side semiconductor switching element functions to output the negative-side voltage to the voltage output terminal.

With this configuration, each of the primary drive signal (as the first one) for the rising of the high-voltage pulse (change in voltage to cause the ejection of the ions) and the primary drive signal (as the second one) for falling of the high-voltage pulse (change in voltage to suspend the ejection of the ions) passes through a different signal path, in other words, goes through a different signal line from the drive signal generator to the switching element drive unit. In this case, while the drive signal generator includes the distribution unit, at the timing of causing the semiconductor switching element to turn on such that the ions start to be ejected from the ion ejector, the primary drive signal (as the first one) that has been distributed by the distribution unit and has not passed through the circuit elements is outputted as the drive signal.

Advantageous Effects of Invention

The present invention provides a time-of-flight spectrometer configured to more significantly reduce a temporal fluctuation in timing of change in high-voltage pulse to cause an ejection of ions from an ion ejector into a flight space or a fluctuation in timing caused by a change in temperature. With this configuration, a time discrepancy between a point in time of initiation of a time-of-flight measurement and that of the ejection of the ions is further reduced, so that high accuracy in measurement of a mass-to-charge ratio as well as high mass resolution is achieved.

DESCRIPTION OF EMBODIMENTS

An OA-TOFMS according to one embodiment of the present invention is described as follows, with reference to the attached drawings.

Figure 1:
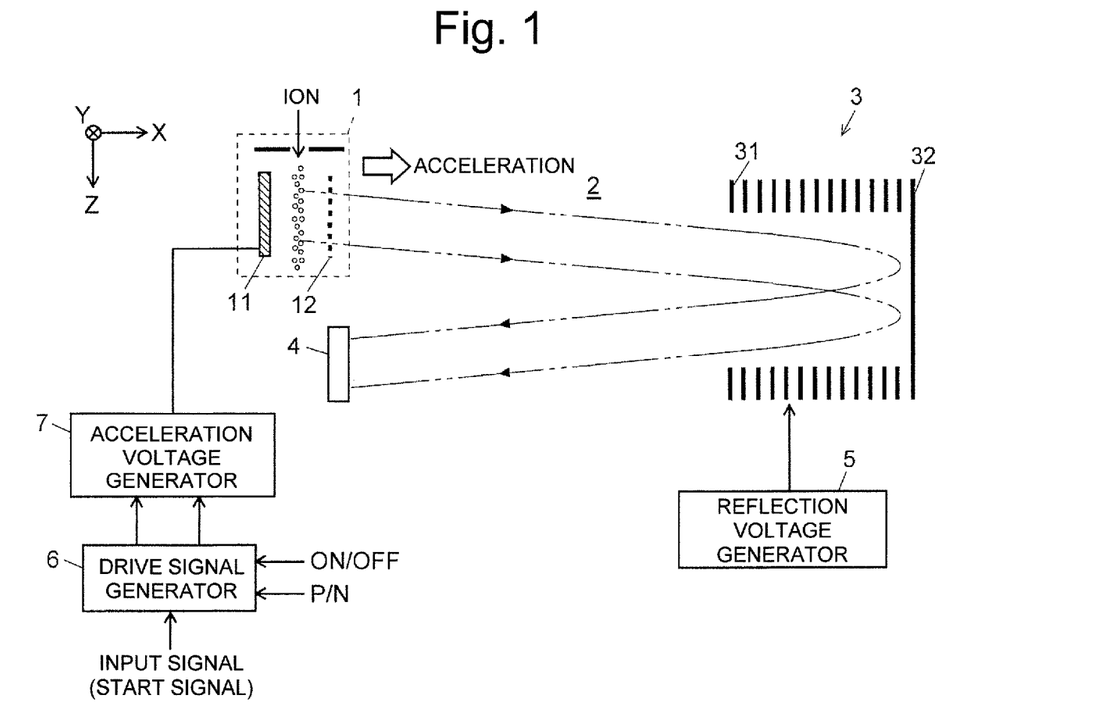
FIG. 1 is a schematic configuration diagram showing an OA-TOFMS according to one embodiment of the present invention.
Figure 2:
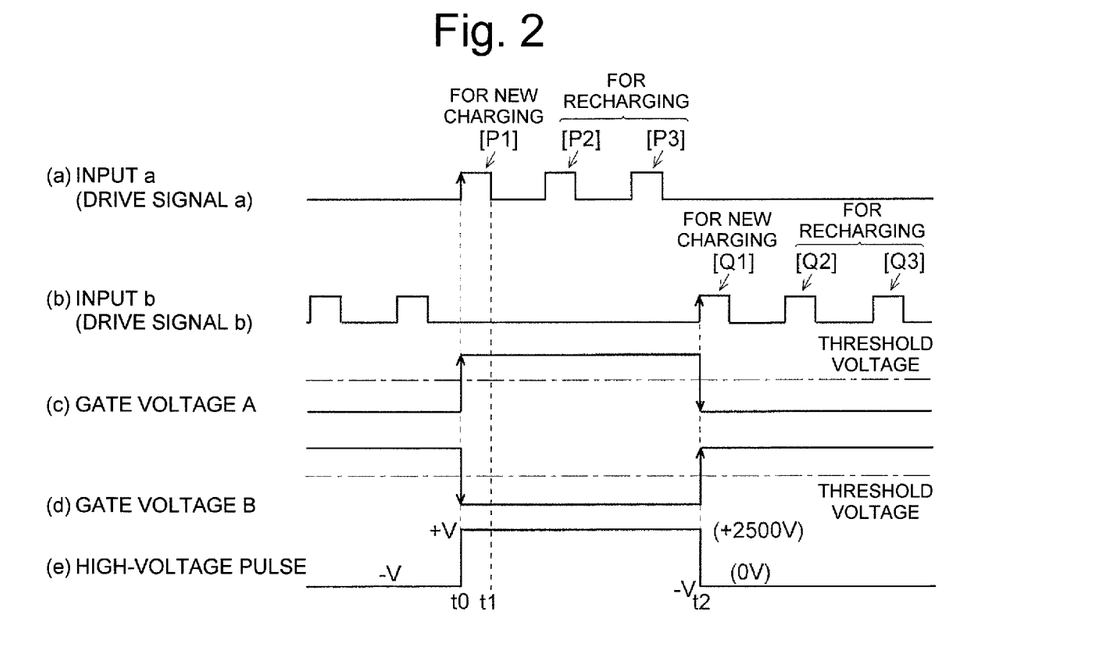
FIG. 2 is a waveform chart showing the voltages in the main components of an acceleration voltage generator of the OA-TOFMS according to the present embodiment.
Figure 3:
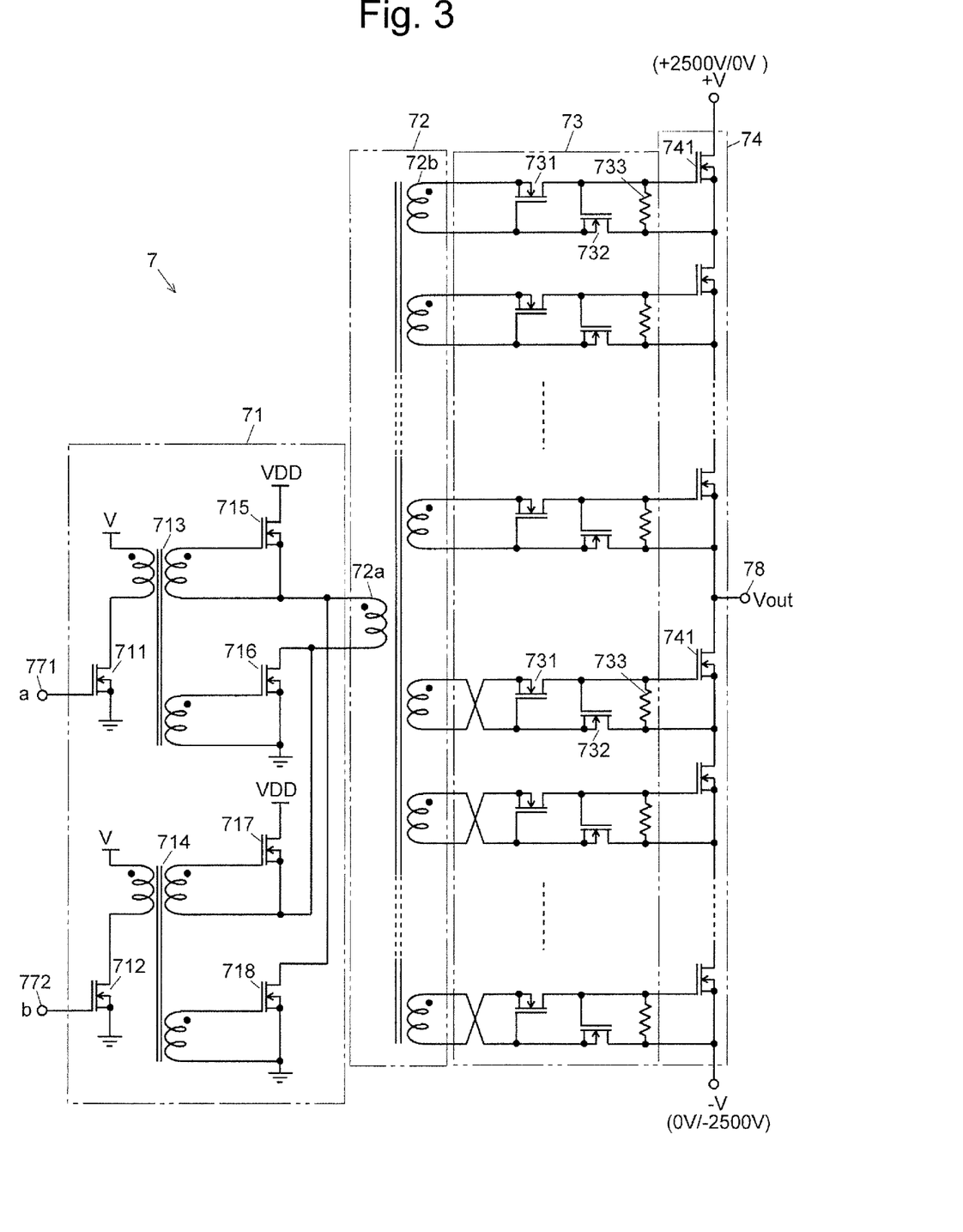
FIG. 3 is a schematic diagram showing a circuit configuration of the acceleration voltage generator in the OA-TOFMS according to the present embodiment.

FIG. 1 is a schematic configuration diagram showing an OA-TOFMS according to the present embodiment. FIG. 3 is a schematic diagram showing a circuit configuration of an acceleration voltage generator in the OA-TOFMS according to the present embodiment. (a) to (e) of FIG. 2 are waveform charts showing the voltages in the main components of the acceleration voltage generator of the OA-TOFMS according to the present embodiment.

In the OA-TOFMS according to the present embodiment, ions generated from a sample in an ion source (not shown) are introduced into an ion ejector 1 in the Z-axis direction, as shown with a downward arrow in FIG. 1. The ion ejector 1 includes a plate-shaped expulsion electrode 11 and a grid-shaped extraction electrode 12, which are arranged to face each other. Based on an input signal, a drive signal generator 6 generates a drive signal for generating a high-voltage pulse. An acceleration voltage generator 7 generates the high-voltage pulse based on the drive signal, and applies the high-voltage pulse to either the expulsion electrode 11 or the extraction electrode 12, or to both. By this operation, ions passing through the space between the expulsion electrode 11 and the extraction electrode 12 are given acceleration energy in the X-axis direction orthogonal to the Z-axis direction, and ejected from the ion ejector 1 into a flight space 2. The ions fly through the flight space 2 which has no electric field, and then enter a reflector 3.

The reflector 3 includes a plurality of annular reflection electrodes 31 and a back plate 32. A predetermined direct-current voltage is applied to each of the reflection electrodes 31 and the back plate 32 from a reflection voltage generator 5. A reflective electric field is thereby formed within the space surrounded by the reflection electrodes 31. The ions are reflected by this electric field, and once more fly through the flight space 2, to eventually reach a detector 4. The detector 4 generates ion-intensity signals according to the amount of ions that have reached the detector 4, and sends those signals to a data processor (not shown). The data processor creates a time-of-flight spectrum that shows the relationship between the time of flight and the ion-intensity signal, with the point in time of the ejection of the ions from the ion ejector 1 defined as the starting point of measuring the time of flight. The data processor further converts the time of flight to a mass-to-charge ratio based on prepared mass calibration information, so as to create a mass spectrum.

Next, a configuration and operation of the acceleration voltage generator 7 will be described in detail. It should be noted that the configuration and operation of the acceleration voltage generator 7 are basically similar to an acceleration voltage generator in a TOFMS disclosed in Patent Literature 1. The acceleration voltage generator 7 may be a modification of the acceleration voltage generator in the TOFMS disclosed in Patent Literature 1. Alternatively, the acceleration voltage generator 7 may include technical items additionally introduced to an acceleration voltage generator in a TOFMS disclosed in PCT/JP2017/039691 for which the applicant had previously filed application.

As shown in FIG. 3, the acceleration voltage generator 7 includes a primary-side drive circuit 71, a pulse transformer 72, a secondary-side drive circuit 73, and a switch circuit 74. The primary-side drive circuit 71, the pulse transformer 72, and the secondary-side drive circuit 73 correspond to a switching element drive unit according to the present invention.

The switch circuit 74 includes a switching element serial circuit in which power MOSFETs 741 are serially connected in multiple stages in both the positive side (above a voltage output terminal 78 in FIG. 3) and the negative side (below the voltage output terminal 78 in FIG. 3). The voltage +V or −V applied between two ends of the switching element serial circuit from a high-voltage power supply (not shown) is dependent on the polarity of the target ions as well as the electrode (the expulsion electrode 11 or the extraction electrode 12) to which the high-voltage pulse is applied. For example, when the polarity of the ions is positive and the high-voltage pulse is applied to the expulsion electrode 11, +V=2500 V and −V=0 V; and when the polarity of the ions is negative and the high-voltage pulse is applied to expulsion electrode 11, +V=0 V and −V=−2500 V. Generally, the polarity of ions is positive and thus, the following description will assume that the polarity of the ions is positive and the high-voltage pulse is applied to the expulsion electrode 11, but the polarity of the ions may be negative. Further, the high-voltage pulse may be applied to the extraction electrode 12 to cause the ejection of the ions.

The pulse transformer 72 is a ring-core transformer. One ring core is provided for a gate terminal of the MOSFET 741 in each of the multiple stages of the switch circuit 74. The secondary winding wound on each of the ring cores is connected to MOSFETs 731 and 732 in the secondary-side drive circuit 73. A primary winding 72a is a single turn of cable passed through all the ring cores. For the cable, a high-voltage insulated wire is used, which electrically insulates the primary side from the secondary side. The number of turns of the secondary winding may be appropriately selected.

The primary-side drive circuit 71 includes a plurality of MOSFETs 711, 712 and 715 to 718, and a plurality of transformers 713 and 714. The primary-side drive circuit 71 further includes a positive-side drive signal input terminal 771 and a negative-side drive signal input terminal 772, to which drive signals a and b are respectively inputted from the drive signal generator 6. The "positive-side" of the positive-side drive signal input terminal 771 indicates, as will be described later with the operation of the circuit, the MOSFETs 741 at the positive side are turned on (or stay in the on-sate) when the signal at high level is inputted to the positive-side drive signal input terminal 771. The "negative-side" of the negative-side drive signal input terminal 772 indicates, as will be described later with the operation of the circuit, the MOSFETs 741 at the negative side are turned on (or stay in the on-state) when the signal at high level is inputted to the negative-side drive signal input terminal 772.

As shown in FIG. 2, while a gate voltage A remains negative and a gate voltage B remains positive, the drive signal a at high level is inputted to the positive-side drive signal input terminal 771 at time t0, whereupon the MOSFET 711 is turned on. As a result, electric current flows in the primary winding of the transformer 713, inducing a predetermined voltage between two ends of the secondary winding. Thus, the MOSFETs 715 and 716 are both turned on. Meanwhile, the MOSFET 712 stays in the off-state, and no current flows in the primary winding of the transformer 714. Accordingly, the MOSFETs 717 and 718 both stay in the off-state. Accordingly, a voltage of VDD is applied between two ends of the primary winding 72a of the pulse transformer 72 from a primary-side power supply (not shown), and the current flows downward in the primary winding 72a in FIG. 3.

This induces a predetermined voltage between two ends of each of secondary windings 72b in the pulse transformer 72. In this situation, the voltage (hereinafter, referred to as the "gate voltage") applied to the gate terminal of each of the MOSFETs 741 via the MOSFETs 731, 732, and a gate discharge resistor 733, each included in the secondary-side drive circuit 73, is approximately expressed by the following formula:

[gate voltage]≈{[primary-side voltage of the pulse transformer 72]/[the number of serial stages of the MOSFETs 741 in the switch circuit 74]}× [the number of turns of the secondary winding in the pulse transformer 72]    (1).

For example, when the primary-side voltage (VDD) of the pulse transformer 72 is 175 V, the number of serial stages of the MOSFETs 741 in the switch circuit 74 is 12, and the number of turns of the secondary winding of the pulse transformer 72 is one, a voltage which is approximately equal to 175/12=14 V is applied to the gate terminal of each of the MOSFETs 741.

At the positive side of the switch circuit 74, when the above voltage is applied in the forward direction between the gate terminal and the source terminal of each of the six MOSFETs 741, the MOSFETs 741 are simultaneously turned on. By comparison, at the negative side of the switch circuit 74, the above voltage is applied in the reverse direction between the gate terminal and the source terminal of each of the six MOSFETs 741, so that the six MOSFETs 741 are turned off. As a result, the voltage supply terminal+V of the high-voltage power supply is almost directly connected to the voltage output terminal 78. Thus, an output voltage of +V=+2500 V appears at the voltage output terminal 78.

When the level of the drive signal a inputted to the positive-side drive signal input terminal 771 is changed to the low level (voltage zero) at time t1, the voltage between the two ends of the primary winding 72a of the pulse transformer 72 becomes zero. However, the gate voltage of each of the MOSFETs 741 stays at approximately the same value due to a charge previously stored in an input capacitance of the gate terminal, i.e., a charging voltage for the gate terminal of the corresponding MOSFET 741. The output voltage from the voltage output terminal 78 is maintained at +V=+2500 V. Thereafter, at time t2, the drive signal b inputted to the negative-side drive signal input terminal 772 is changed to the high level. This time, the MOSFET 712 is turned on. Along with this, the MOSFETs 717 and 718 are turned on, whereupon a voltage in the opposite direction to the previous case is applied between the two ends of the primary winding 72a of the pulse transformer 72. Thus, the current flows in the reverse direction. With this, a voltage is induced between the two ends of each of the secondary windings 72b of the pulse transformer 72 in the opposite direction to the previous case. Thus, the six MOSFETs 741 at the positive side of the switch circuit 74 are turned off, whereas the six MOSFETs 741 at the negative side are turned on. Accordingly, the output voltage from the voltage output terminal 78 (the value of −V) becomes zero.

When the level of the drive signal b inputted to the negative-side drive signal input terminal 772 is changed to the low level (voltage zero), the voltage between the two ends of the primary winding of the pulse transformer 72 becomes zero. However, the gate voltage of each of the six MOSFETs 741 at the negative side stays at approximately the same value due to a charge previously stored in an input capacitance of the gate terminal, i.e., a charging voltage for the gate terminal, of the six MOSFETs 741 at the negative side. Accordingly, the output voltage from the voltage output terminal 78 stays at 0 V.

The acceleration voltage generator 7 basically generates the high-voltage pulse with the previously described operations at a timing corresponding to the drive signals a and b inputted to the positive-side drive signal input terminal 771 and the negative-side drive signal input terminal 772. The high-voltage pulse has a peak value of +2500 V. As seen from FIG. 2, a pulse width of the high-voltage pulse is approximately equal to a period between the point in rising time of the drive signal a and the point in rising time of the drive signal b. As shown in (e) of FIG. 2, during a period between when the high-voltage pulse is generated and when the high-voltage pulse is next generated, the voltage from the voltage output terminal 78 stays at −V (−V=0 in the above example). This configuration requires, even after the drive signal b is changed from the high level to the low level, each of the MOSFETs 741 at the negative side of the switch circuit 74 to stay in the on-state, and concurrently requires each of the MOSFETs 741 at the positive side of the switch circuit 74 to stay in the off-state. Further, when the high-voltage pulse is at high level for a relatively long period of time, in order to maintain the voltage from the voltage output terminal 78 at +V, each of the MOSFETs 741 at the positive side of the switch circuit 74 needs to stay in the on-state and each of the MOSFETs 741 at the negative side of the switch circuit 74 needs to stay in the off-state even after the drive signal a is changed from the high level to the low level.

For example, when the drive signal b is at high level, the input capacitance of the gate terminal of each of the MOSFETs 741 is charged with the current flowing from the corresponding secondary winding 72b of the pulse transformer 72, and thus, the charging voltage for the gate terminal remains even after the drive signal b is changed to the low level. However, due to a natural discharge, the charging voltage gradually decreases as time elapses. In view of this, in order to cause the gate voltage of each of the MOSFETs 741 at the negative side to reliably stay above a threshold voltage, the drive signal b is inputted to the negative-side drive signal input terminal 772 at an appropriate time interval even during the period for which the high-voltage pulse is not generated (i.e., 0 V). By this operation, a pulsed voltage is applied to the gate terminal of each of the MOSFETs 741 at the negative side, so that the input capacitance of the gate terminal is recharged. Further, during the period for which the high-voltage pulse is maintained at high level, in order to cause the gate voltage of each of the MOSFETs 741 at the positive side to reliably stay above the threshold voltage, the drive signal a is inputted to the positive-side drive signal input terminal 771 at the appropriate time interval. By this operation, the pulsed voltage is applied to the gate terminal of each of the MOSFETs 741 at the positive side, so that the input capacitance of the gate terminal is recharged.

In (a) of FIG. 2, the drive signal a for newly charging the input capacitance of the gate terminal of each of the MOSFETs 741 at the positive side is shown with [P1], and the drive signal a for recharging the corresponding gate terminal is shown with [P2] and [P3]. Further, in (b) of FIG. 2, the drive signal b for newly charging the input capacitance of the gate terminal of each of MOSFETs 741 at the negative side is shown with [Q1], and the drive signal b for recharging the corresponding gate terminal is shown with [Q2] and [Q3]. As disclosed in PCT/JP2017/039691, the gate terminal is preferably recharged at a time interval according to a measurement cycle, in other words, a time interval for the ejection of the ions; but the time interval is not related to the claim of the present invention and thus, a description thereof will be omitted. In any case, each of the drive signals a and b is inputted at the appropriate time interval such that the input capacitance of the gate terminal is recharged. With this configuration, it is possible to reduce an influence of the decrease in the charging voltage for the MOSFETs 741 due to the natural discharge. Thus, it is possible to suppress a time discrepancy in timing at which the high-voltage pulse changes.

Figure 4:
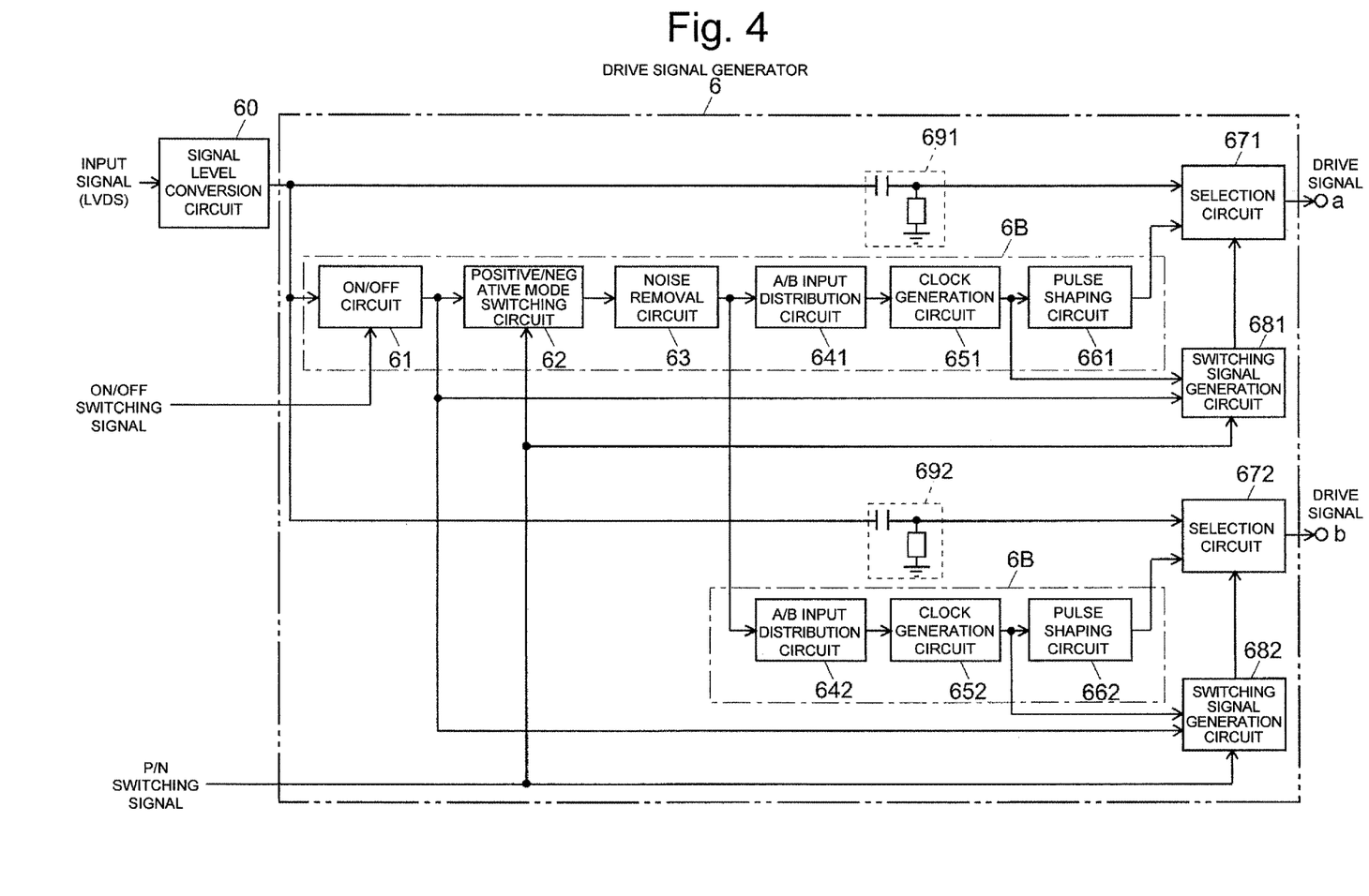
FIG. 4 is a schematic diagram showing a block configuration of a drive signal generator in the OA-TOFMS according to the present embodiment.

As described above, the drive signal generator 6 generates two types of drive signals a and b, each to be inputted to the acceleration voltage generator 7. A TOFMS according to the present embodiment is characterized by the configuration of the drive signal generator 6. FIG. 4 is a schematic diagram showing the block configuration of the drive signal generator 6 in the TOFMS according to the present embodiment. (a) to (l) of FIG. 5 are waveform charts in the main components of the drive signal generator 6 in the TOFMS according to the present embodiment.

As shown in FIG. 4, the drive signal generator 6 includes an edge detection circuit 691 and 692, a secondary drive signal generator 6B, a selection circuit 671 and 672, and a switching signal generation circuit 681 and 682. At the previous stage of the drive signal generator 6, a signal level conversion circuit 60 is connected to the drive signal generator 6.

The signal level conversion circuit 60 receives a start signal from a substrate, on which another electric circuit is mounted, based on, for example, the Low Voltage Differential Signaling (LVDS) method suitable for high-speed signal transmission. The start signal is configured to determine the timing of initiation of the measurement in the OVA-TOFMS, in other words, the timing of the ejection of the ions. The signal level conversion circuit 60 converts a voltage level of the start signal as a low-voltage differential signal to an LCTTL or LVCMOS standard voltage level (that is typically 3.3 V). The start signal, the voltage level of which has been converted (see (a) of FIG. 5: hereinafter, unless otherwise stated, the start signal, the voltage level of which has been converted, may be simply referred to as "start signal"), is inputted to the edge detection circuits 691, 692 and the secondary drive signal generator 6B in the drive signal generator 6.

Figure 5:
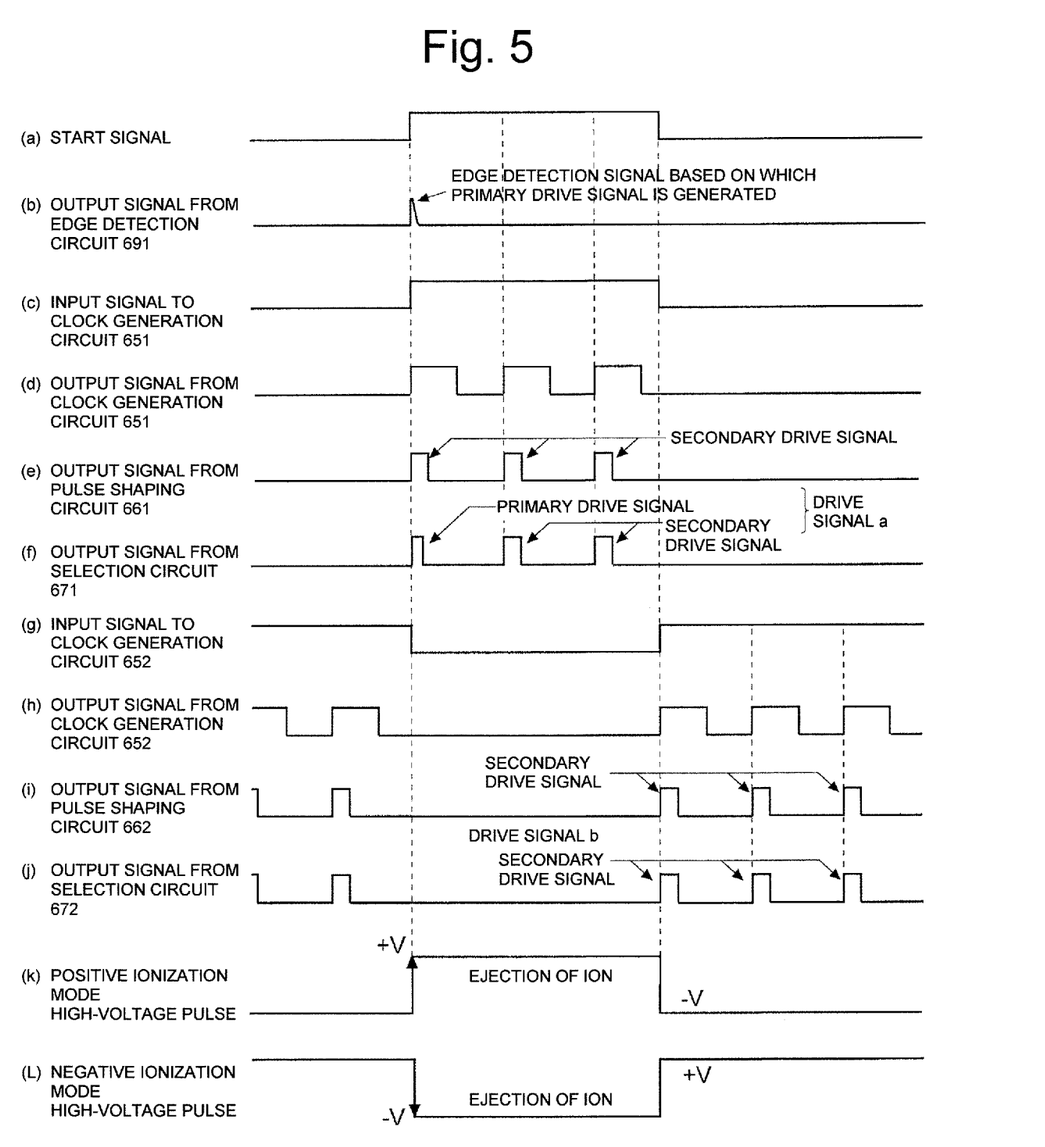
FIG. 5 is a waveform chart showing the signals in the main components of the drive signal generator in the OA-TOFMS according to the present embodiment.

The edge detection circuits 691 and 692 are CR differentiation circuits, each detecting a rising edge of the start signal to generate an edge detection signal (see (b) of FIG. 5). The edge detection circuits 691 and 692 respectively output the edge detection signal to the selection circuits 671 and 672. Meanwhile, the secondary drive signal generator 6B generates a secondary drive signal (see (e) of FIG. 5) based on the start signal, and outputs the secondary drive signal to the selection circuits 671 and 672. The selection circuits 671 and 672 respectively include two circuits: one circuit configured to generate a signal at a predetermined time interval as a primary drive signal based on the rising edge of the edge detection signal inputted; the other circuit configured, based on a switching control signal inputted from the switching signal generation circuits 681 and 682, to select the primary drive signal or the secondary drive signal as a drive signal to be outputted. Note that, the edge detection circuits 691 and 692 are configured to detect the rising edge of the start signal and are not required to detect a falling edge of the start signal. Thus, each of the edge detection circuits 691 and 692 has a configuration in which the signal outputted as a result of the edge detection at the negative voltage side is mostly clamped with a diode (not shown). With this configuration, the edge detection signal at the negative voltage side is not outputted.

The secondary drive signal generator 6B includes an on/off circuit 61, a positive/negative mode switching circuit 62, a noise removal circuit 63, two types of AB input distribution circuits 641, 642, two types of clock generation circuits 651, 652, and two types of pulse shaping circuits 661, 662. The secondary drive signal generator 6B generates the secondary drive signal based on the start signal inputted.

More specifically, an on/off control signal is inputted from another control circuit to the on/off circuit 61, the on/off control signal to switch whether or not the high-voltage pulse is actually to be generated, in other words, whether or not the acceleration voltage generator 7 is to operate. Then, the on/off circuit 61 allows the start signal to pass only when the on/off control signal is in an on-state (e.g., at high level), and blocks the start signal when the on/off control signal in in an off-state (e.g., at low level). The output from the on/off circuit 61 is inputted to the positive/negative mode switching circuit 62 and the switching signal generation circuits 681 and 682. Accordingly, when the on/off control signal is in the off-state, no significant signal is inputted to the positive/negative mode switching circuit 62, the switching signal generation circuit 681 and 682.

A P/N control signal for switching a positive/negative ionization mode is inputted from the other control circuit to the positive/negative mode switching circuit 62. Then, the positive/negative mode switching circuit 62 outputs the start signal without any modification or outputs the start signal that has been inverted, each according to a voltage level of the P/N control signal. More specifically, when the P/N control signal is at a level corresponding to the positive ionization mode, the positive/negative mode switching circuit 62 allows the output signal from the on/off circuit 61 to pass. Thus, the start signal shown in (a) of FIG. 5 is outputted almost as it is.

When a pulsed noise at a short time interval, which is caused by an external noise or the like, exists in a signal line output from the positive/negative mode switching circuit 62, the noise removal circuit 63 serves as a filter for removing the pulsed noise. Note that, the noise removal circuit 63 is not essential to generate the secondary drive signal and thus may be omitted.

The signal, the noise of which has been removed at the noise removal circuit 63, and the signal, the polarity of which has been inverted according to the voltage level of the P/N control signal are inputted to the A/B input distribution circuits 641 and 642. Then, the A/B input distribution circuits 641 and 642 respectively distribute these signals inputted to the positive-side drive signal input terminal 771 and to the negative-side drive signal input terminal 772. In other words, in the positive ionization mode, the A/B input distribution circuit 641 outputs a signal at high level during a period for which the output signal outputted from the noise removal circuit 63 based on the start signal is at high level (see (c) of FIG. 5). On the other hand, the A/B input distribution circuit 642 outputs a signal at low level during the period for which the output signal outputted from the noise removal circuit 63 based on the start signal is at high level (see (g) of FIG. 5). In the negative ionization mode, the signals respectively outputted from the A/B input distribution circuit 641 and 642 are almost swapped with each other.

Each of the two types of clock generation circuits 651 and 652 respectively receives the input signal to generate a clock signal of a rectangular shape at a predetermined frequency. (d) of FIG. 5 shows a clock signal generated corresponding to a signal shown in (c) of FIG. 5, and (h) of FIG. 5 shows a clock signal generated corresponding to a signal shown in (g) of FIG. 5. The clock signal is generated only during a period for which the input signal to each of the clock generation circuits 651 and 652 is at high level. The clock signals outputted from the clock generation circuits 651 and 652 are respectively inputted to the pulse shaping circuits 661 and 662 as well as to the switching signal generation circuits 681 and 682.

The pulse shaping circuits 661 and 662 respectively detect a rising edge of the clock signal generated by the clock generation circuit 651 and 652, so as to generate a signal to rise at the rising edge, the signal having a predetermined width. (e) of FIG. 5 shows a signal generated corresponding to the clock signal shown in (d) of FIG. 5, and includes three secondary drive signals in this example. (i) of FIG. 5 shows a signal generated corresponding to the clock signal shown in (h) of FIG. 5, and includes three secondary drive signals in this example.

The clock generation circuits 651 and 652 as well as the pulse shaping circuits 661 and 662 are configured to generate the secondary drive signal mainly for recharging. As will be described later, the secondary drive signal generator 6B is configured to generate a drive signal to be used for timing at which the MOSFETs are turned on or turned off to end the ejection of the ions. When a cycle of the secondary drive signal for recharging needs to be changed according to the measurement cycle, the frequency of the clock signal, which each of the clock generation circuits 651 and 652 generates, may be modified according to the measurement cycle.

Based on the switching control signal inputted from the switching signal generation circuits 681 and 682, and based on the edge detection signal generated from the edge detection circuits 691 and 692, the selection circuits 671 and 672 respectively select the drive signal to be outputted by switching between the primary drive signal (generated in the selection circuits 671 and 672) and the secondary drive signal (outputted from the pulse shaping circuits 661 and 662), and output the drive signal selected. The start signal that has been subjected to the gating at the on/off circuit 61, in other words, the start signal generated only when the high-voltage pulse is actually generated and a positive/negative mode switching signal are inputted to the switching signal generation circuits 681 and 682. Based on the positive/negative mode switching signal, the switching control signals respectively outputted from the switching signal generation circuit 681 and the switching signal generation circuits 682 are swapped with each other.

For example, in the positive ionization mode, when a high-voltage pulse shown in (k) of FIG. 5 needs to be generated, the switching signal generation circuit 681 outputs the switching control signal to the selection circuit 671 as follows: to select the primary drive signal only for a predetermined period from the rising edge of the start signal; and outside the predetermined period, to select the secondary drive signal outputted from the pulse shaping circuit 661 during a period for which the clock signals inputted from the clock generation circuits 651 and 652 are at high level. In this state, the selection circuit 671 outputs a signal shown in (f) of FIG. 5. With this configuration, the acceleration voltage generator 7 obtains the drive signal a that includes: the primary drive signal configured to turn on the MOSFET at the final stage; and the secondary drive signal configured to recharge the capacitance of the gate terminal to maintain the corresponding MOSFET in the on-state.

When the selection circuit 671 operates as described above, the switching signal generation circuit 682 gives the selection circuit 672 (as the other of the two selection circuits) the switching control signal to constantly select the secondary drive signal outputted from the pulse shaping circuit 662. Based on the switching control signal from the switching signal generation circuit 682, the selection circuit 672 continues to output the secondary drive signal as is outputted from the pulse shaping circuit 662. In this state, as shown in (j) of FIG. 5, the output from the selection circuit 672 is almost the same as in (i) of FIG. 5. With this configuration, the acceleration voltage generator 7 obtains the drive signal b that includes the primary drive signal configured to turn off the MOSFET at the final stage, and the secondary drive signal configured to recharge the capacitance of the gate terminal to maintain the corresponding MOSFET in the off-state. Note that, the primary drive signal here is not based on the edge detection signal, but is generated by the secondary drive signal generator 6B.

The drive signals a and b described above are outputted from the drive signal generator 6, whereupon in the positive ionization mode, for example, the acceleration voltage generator 7 outputs a high-voltage pulse of positive polarity as shown in (k) of FIG. 5.

On the other hand, in the negative ionization mode, the operation of the switching signal generation circuit 681 and the operation of the switching signal generation circuit 682 are swapped with each other. Accordingly, the operation of the selection circuit 671 and the operation of the selection circuit 672 are swapped with each other. In other words, the selection circuit 672 generates the primary drive signal based on the edge detection signal obtained from the edge detection circuit 692. Then, the selection circuit 672 selects the drive signal to be outputted by switching between the corresponding primary drive signal and the secondary drive signal outputted from the pulse shaping circuit 662, and outputs the drive signal selected. Meanwhile, the selection circuit 671 continues to output the secondary drive signal inputted from the pulse shaping circuit 661 as it is. As a result, the acceleration voltage generator 7 outputs a high-voltage pulse of negative polarity as shown in (1) of FIG. 5. The polarity of the high-voltage pulse naturally varies depending on whether the high-voltage pulse is applied to the extraction electrode 12 or the expulsion electrode 11.

What is important in the drive signal generator 6 is that the drive signal (that is configured to determine the timing at which the level of the high-voltage pulse is changed, or edges shown with arrows in (k) and (l) of FIG. 5, to start the ejection of the ions from the ion ejector 1) corresponds to the primary drive signal that the selection circuits 671 and 672 generate by only adjusting the edge detection signal in its signal width, the edge detection signal generated by the edge detection circuits 691 and 692 based on the start signal. On the other hand, the drive signal (that is configured to determine the timing at which the level of the high-voltage pulse is changed to end the ejection of the ions from the ion ejector 1) corresponds to the drive signal that the secondary drive signal generator 6B generates.

In other words, as seen from FIG. 4, in the drive signal generator 6, the primary drive signal described above passes through a limited number of logical circuit elements, while the secondary drive signal is outputted from the secondary drive signal generator 6B including multiple circuit elements. Particularly, here, the edge detection circuits 691 and 692 are the CR differentiation circuits, and thus include no active element (semiconductor element). Generally, a circuit element is a factor to cause jitter or a temporal fluctuation of a signal due to a change in temperature. Accordingly, when the signal passes through less number of circuit elements, particularly semiconductor elements, the jitter or the temporal fluctuation of the signal due to the change in temperature becomes less.

With the characteristic configuration described above, the drive signal generator 6 reduces the jitter in rising of the primary drive signal to determine the timing at which the level of the high-voltage pulse is changed to start the ejection of the ions or the temporal fluctuation of signals due to the change in temperature. Accordingly, it is possible to suppress the discrepancy or fluctuation in timing of start of the ejection of the ions. In the data processor, the timing of the initiation of the time-of-flight measurement accurately coincides with the timing of the start of the ejection of the ions, so that high accuracy in measurement of the mass-to-charge ratio as well as high mass resolution is achieved.

Note that, the circuits to generate the drive signals shown in (a) and (b) of FIG. 2 or (f) and (j) of FIG. 5 are not naturally limited to the block configuration shown in FIG. 4. Accordingly, the circuit configuration of the drive signal generator 6 may be appropriately modified; but in any modifications, with the configuration where the signal path of the primary drive signal to determine the timing at which the level of the high-voltage pulse is changed to start the ejection of the ions is a shortcut of the circuit to generate the secondary drive signal, the object of the present invention is clearly achieved.

In the foregoing embodiment, the TOFMS has a function of switching the positive/negative ionization mode, but may not naturally have the function. Additionally, the acceleration voltage generator 7 controls to turn on or off the plurality of MOSFETs in the final stages based on the two types of drive signals, but may turn on or off the plurality of MOSFETs in the final stages based on one type of signal. In this case, the circuit configuration of the drive signal generator 6 is naturally changed accordingly.

Further, the foregoing embodiment is merely an example of the present invention, and any change, addition, or modification appropriately made within the spirit of the present invention will naturally fall within the scope of claims of the present application.

For example, as opposed to the foregoing embodiment, in which the present invention is applied to an OA-TOFMS, the present invention can be applied to other types of time-of-flight mass spectrometer, such as an ion trap time-of-flight mass spectrometer in which ions held in a three-dimensional quadrupole ion trap or linear ion trap are accelerated and sent into a flight space, or a time-of-flight mass spectrometer in which ions generated from a sample in a MALDI or similar ion source are accelerated and sent into a flight space.

REFERENCE SIGNS LIST

1 . . . Ion Ejector
11 . . . Expulsion Electrode
12 . . . Extraction Electrode
2 . . . Flight Space
3 . . . Reflector
31 . . . Reflection Electrode
32 . . . Back Plate
4 . . . Detector
5 . . . Reflection Voltage Generator
6 . . . Drive Signal Generator
6B . . . Secondary Drive Signal Generator
60 . . . Signal Level Conversion Circuit
61 . . . On/Off Circuit
62 . . . Positive/Negative Mode Switching Circuit
63 . . . Noise Removal Circuit
641, 642 . . . AB Input Distribution Circuit
651, 652 . . . Clock Generation Circuit
661, 662 . . . Pulse Shaping Circuit
671, 672 . . . Selection Circuit
681, 682 . . . Switching Signal Generation Circuit
691, 692 . . . Edge Detection Circuit
7 . . . Acceleration Voltage Generator
71 . . . Primary-side Drive Circuit
711, 712, 715, 716, 717, 718 . . . MOSFET
713, 714 . . . Transformer
72 . . . Pulse Transformer
72a . . . Primary Winding
72b . . . Secondary Winding
73 . . . Secondary-side Drive Circuit
731, 732 . . . MOSFET
733 . . . Gate Discharge Resistor
74 . . . Switch Circuit
741 . . . Power MOSFET
771 . . . Positive-Side Drive Signal Input Terminal
772 . . . Negative-side Drive Signal Input Terminal
78 . . . Voltage Output Terminal

The invention claimed is:

1. A time-of-flight mass spectrometer comprising:
   an ion ejector configured to eject ions to be measured into a flight space by imparting acceleration energy to the ions by an effect of an electric field created by a voltage applied to an electrode; and
   a high-voltage pulse generator configured to generate a high-voltage pulse for causing an ejection of the ions and apply the high-voltage pulse to the electrode,
   the high-voltage pulse generator including:
   a) a direct-current power supply configured to generate a high direct-current voltage;
   b) a switch circuit including a semiconductor switching element configured to generate the high-voltage pulse by switching the high direct-current voltage;
   c) a drive signal generator configured to output, as a drive signal, a primary drive signal and a secondary drive signal, each based on a start signal that has a voltage level changed at a timing of the ejection of the ions, the secondary drive signal having a delay from the primary drive signal to cause the semiconductor switching element to stay in an on-state or an off-state,
   the drive signal generator including a secondary drive signal generator to generate the secondary drive signal, and configured to output, as the drive signal, the primary drive signal that does not pass through the secondary drive signal generator, at least at a timing of causing the semiconductor switching element to turn on in order to cause the ejection of the ions from the ion ejector to start; and
   d) a switching element drive unit configured to charge or discharge a capacitance of a control terminal of the semiconductor switching element according to the drive signal outputted by the drive signal generator, in order to cause the semiconductor switching element to turn on or stay in the on-state or cause the semiconductor switching element to turn off or stay in the off-state.

2. The time-of-flight mass spectrometer according to claim 1, wherein
   the drive signal generator further includes an edge detection circuit configured to detect a change in the voltage level of the start signal at the timing of the ejection of the ions, and the primary drive signal is a signal generated based on a signal outputted from the edge detection circuit.

3. The time-of-flight mass spectrometer according to claim 2, wherein
   the edge detection circuit is a differentiation circuit including a capacitor element and a resistor element.

4. The time-of-flight mass spectrometer according to claim 1, wherein
   the drive signal generator further includes a drive signal output switching unit configured to switch between a state in which the drive signal is outputted and a state in which outputting of the drive signal is suspended.

5. The time-of-flight mass spectrometer according to claim 1, wherein
   the secondary drive signal generator includes a positive/negative switching unit configured, based on switching between a positive ionization mode and a negative ionization mode, to invert a polarity of the start signal inputted.

6. The time-of-flight mass spectrometer according to claim 1, wherein
   the switch circuit includes:
   a positive-side semiconductor switching element configured, when in an on-state, to output a positive-side voltage from the direct-current power supply to a voltage output terminal; and
   a negative-side semiconductor switching element configured, when in an on-state, to output a negative-side voltage from the direct-current power supply to the voltage output terminal,
   the switching element drive unit includes:
   a first switching element drive unit configured, in response to a first drive signal, to charge the control terminal to a voltage at which the positive-side semiconductor switching element turns on or stays in an on-state; and
   a second switching element drive unit configured, in response to a second drive signal, to charge the control terminal to a voltage at which the negative-side semiconductor switching element turns on or stays in an on-state, and
   the secondary drive signal generator further includes a distribution unit configured to distribute a signal based on the start signal inputted to a signal corresponding to the first switching element drive unit and to a signal corresponding to the second switching element drive unit, and based on the signals distributed by the distribution unit, separately generates at a predetermined time interval each of the secondary drive signal to cause the positive-side semiconductor switching element to stay in the on-state or the off-state and the secondary drive signal to cause the negative-side semiconductor switching element to stay in the on-state or the off-state.

* * * * *